July 7, 1970 A. B. NEWTON 3,518,838

THERMOELECTRIC DEVICES

Filed Sept. 10, 1962 2 Sheets-Sheet 1

INVENTOR.
ALWIN B. NEWTON
BY
ATTORNEY

July 7, 1970 A. B. NEWTON 3,518,838

THERMOELECTRIC DEVICES

Filed Sept. 10, 1962 2 Sheets-Sheet 2

INVENTOR.
ALWIN B. NEWTON
BY
Sidney N. Rosenfeld
ATTORNEY

United States Patent Office 3,518,838

Patented July 7, 1970

3,518,838
THERMOELECTRIC DEVICES

Alwin B. Newton, Spring Garden Township, York County, Pa., assignor to Borg-Warner Corporation, Chicago, Ill., a corporation of Illinois Filed Sept. 10, 1962, Ser. No. 222,371
Int. Cl. F25b *21/02*
U.S. Cl. 62—3 11 Claims

ABSTRACT OF THE DISCLOSURE

A thermoelectric module which includes alternating p-type and n-type thermoelectric elements having heat exchange fins interposed therebetween. The fins are constructed from an electrically conductive material so that unidirectional electrical energy is passed in series through the heat exchanger sections and the thermoelectric elements in series.

BACKGROUND AND SUMMARY OF THE INVENTION

This invention relates to a thermoelectric conditioning device and more particularly to a novel thermocouple module.

A thermocouple may be considered as a device for utilizing the junction temperature differential realized upon passing uni-directional current through the junction of two dissimilar thermoelectric materials. This is known as the Peltier effect and recent advances in this field have yielded materials having a relatively high thermoelectric efficiency. Exemplary of such materials are semi-conductors and the two distinct thermoelectric types used are the n-type and the p-type semi-conductor materials. The simplest form of a thermoelectric module employing n- and p-types is that wherein the n- and p-types abut and a uni-directional current is passed therethrough. Depending upon the polarity of the current, the junction itself will either absorb or liberate heat while the terminal portions of the n- and p-types will either liberate or absorb heat respectively.

A common form of thermocouple module which has evolved according to present practice is the linking of the n- and p-types by generally flat conductors spaced from each other. The n- and p-types are sandwiched between alternate conductors and the series current passed is alternately from one set of conductors to the other, the two sets defining two parallel planes. In operation, one set of conductors in the above typical prior art construction liberates heat while the other set absorbs heat. In practice, the set which absorbs heat may be utilized in a refrigeration environment, the heat absorbing members effecting heat transfer between them and a fluid which is to be cooled. The side of the module which liberates heat is often in heat-exchange relation with a coolant fluid. Alternatively, a thermocouple module may be used to heat a fluid and the heat liberating surface of the module is placed in heat-exchange relationship with the fluid to be heated.

Another form of thermocouple module employs a plurality of fins placed in heat-exchange relation with the heat absorbing (or heat liberating) portion of the module. The fins are generally integral with a basal member which in turn is in heat-exchange relation with the heat absorbing (or heat liberating) portion of the module. The basal member must, however, be electrically insulated from the module to preclude shorting the thermoelectric materials.

Inherent in the construction and use of prior thermoelectric modules for conditioning, only a single surface of a conductor between the n- and p-types has been utilized to effect heat-exchange with it and a fluid. According to this invention, a thermocouple embodies a novel construction which permits the use of more than a single conditioning surface between opposite thermoelectric material types. Another characterization of the invention is the provision of a plurality of conductors between opposite thermoelectric types, the conductors also serving to effect heat transfer. The surfaces of the plurality of conductors are placed in heat-exchange relationship with a fluid to be conditioned and a greater heat transfer may take place because of the greater surface contact between the fluid and the conductors which form a part of the module junction.

Further, practice of the present invention eliminates the need for a thermally conducting but electrically insulating interface between a continuous finned radiator element and a plurality of junctions in one plane.

It is accordingly an object of this invention to provide an improved thermocouple module displaying more than a single surface adapted to be placed in heat-exchange relationship with a fluid.

It is a further object of this invention to provide a novel thermocouple module wherein a plurality of planar connecting elements, generally parallel to each other, are secured between the dissimilar thermoelectric types.

It is a further object of this invention to provide a new and improved thermoelectric module, which embodies a serpentine ribbon conductor serving as the junction between two dissimilar thermoelectric types, the segments of the conductor being generally parallel to each other and the spaces therebetween defining a fluid path.

It is a further object of this invention to provide a novel air conditioning device embodying a plurality of the thermocouple modules of this invention.

Yet another object of the invention is to provide a novel thermocouple module wherein the electrical connecting element, interconnecting the dissimilar thermoelectric types, is utilized to both transfer heat and conduct the current which powers the thermocouple.

These and other objects will be apparent from the following description of the invention.

Referring now to the drawings.

Figures 1, 2, 3, 4, 5:
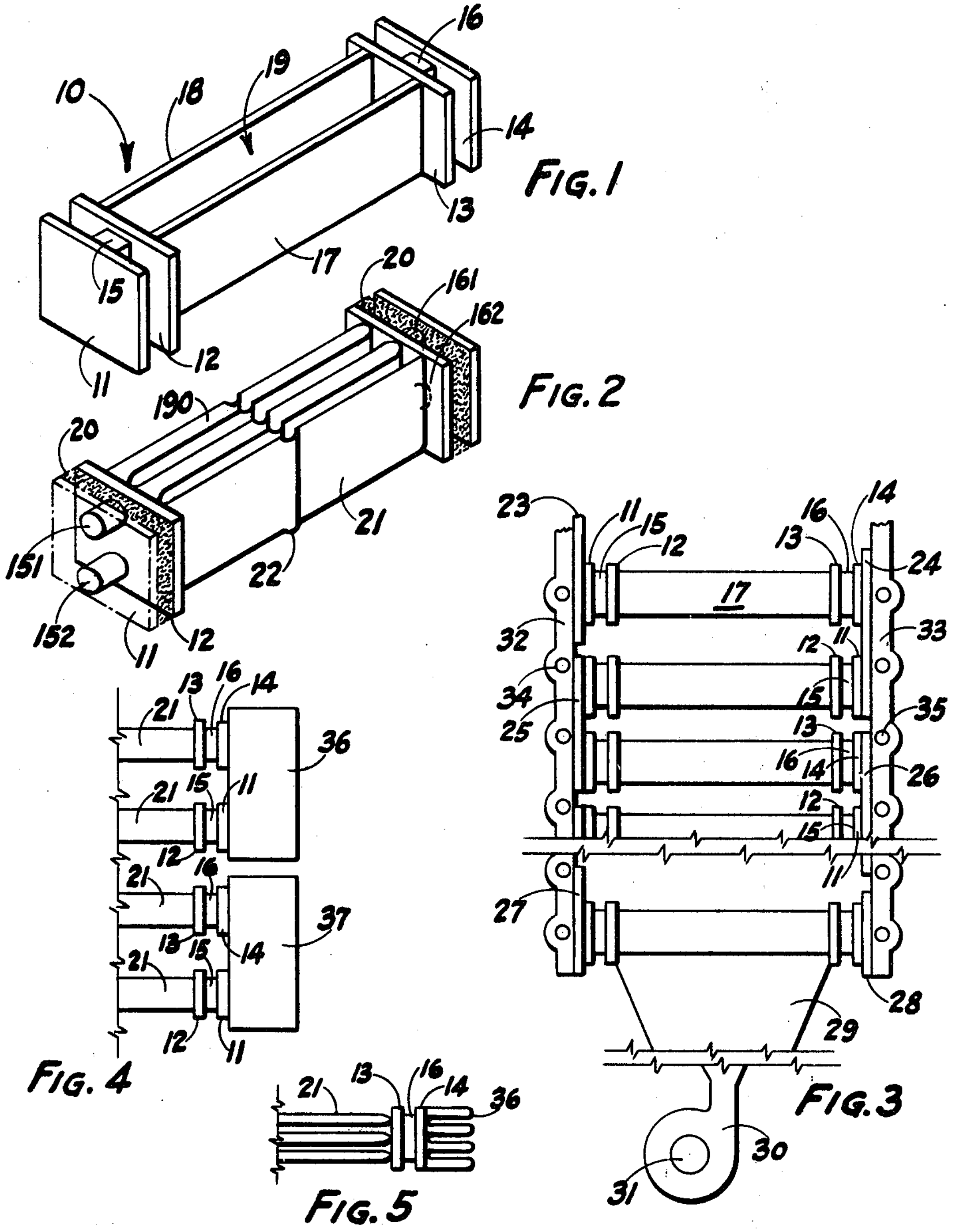
FIG. 1 is a perspective view of a first embodiment of a novel thermoelectric module according to this invention.
FIG. 2 is a perspective view, partially in phantom lines, illustrating several modifications of the module shown in FIG. 1.
FIG. 3 is a partly schematic cross-sectional view of a device embodying a plurality of the FIG. 1 thermoelectric modules according to this invention for conditioning a fluid.
FIG. 4 is a partial cross-sectional view of a modification of the device of FIG. 3.
FIG. 5 is a top plan view of the device of FIG. 4.

Referring now to FIG. 1 of the drawings, the numeral 10 denotes generally the novel thermocouple module of this invention, and includes parallel plates 11, 12, 13 and 14, all formed of an electrically conducting material. The numeral 15 denotes a block of semi-conductor material of one thermoelectric type, and here may be regarded as being of n-type. The numeral 16 denotes a thermoelectric material of the opposite type, and here may be regarded as p-type. The numerals 17 and 18 denote generally flat conductors disposed in parallel relation to each other and connected between plates 12 and 13. Thermoelectric blocks 15 and 16 are secured to plates 11, 12, 13 and 14 by soldering, as are conductors 17 and 18 connected to plates 12 and 13. Because thermoelectric materials are very poor thermal conductors, plates 12 and 13, in contact with thermoelectric blocks 15 and 16 over entire faces of the latter, are employed. Direct connection of conductors 17 and 18 to the thermoelectric materials would effectively waste surface area of the materials, i.e., the area of the materials between the conductors, and hence reduce heat-exchange between the material faces and the conductors. The space between the inner or facing surface of conductors 17 and 18 is denoted by the numeral 19, this space being regarded as defining a portion of a fluid path, the latter disposed generally at right angles to the longitudinal axes of conductors 17 and 18. As will be set forth more fully hereafter, plates 11 and 14 communicate with a source of unidirectional current. Current passing in one polarity through a circuit in the module of FIG. 1, including plate 11, n-type block 15, plate 12, conductors (junction connectors) 17 and 18, plate 13, p-type material 16 and thermoelectric block 15, causes the conductors 17 and 18 (along with the junction elements 12 and 13) to absorb heat while exterior or outward facing plates 11 and 14 liberate heat. Reversal of this assumed polarity will cause conductors (junction connectors) 17 and 18 to liberate heat, while the outward facing plates 11 and 14 will absorb heat. A fluid which is to be conditioned is passed through space 19 and across the outer faces of 17 and 18, and is thus in heat-exchange relationship with the surfaces of conductors 17 and 18 and is conditioned.

Referring now to FIG. 2 of the drawings, several modifications of the thermocouple illustrated in FIG. 1 are shown. As before, numerals 11, 12, 13 and 14 represent parallel plates and in lieu of the single semi-conductor type block 15 of FIG. 1, a plurality of semi-conductor elements (all of the same type) denoted by the numerals 151 and 152 may be employed. Similarly, in lieu of the single semi-conductor block 16 of FIG. 1, a plurality of semi-conductor elements (all of the same type) denoted by the numerals 161 and 162 may be employed between plates 13 and 14. The semi-conductor elements 151, 152, 161 and 162 are termed billets. The spaces around the billets may be sealed and insulated by means of any suitable insulation denoted by the numeral 20. Instead of the plurality of generally flat conductors 17 and 18, illustrated at FIG. 1, a continuous serpentine conductor denoted by the numeral 21 may be employed. Preferably, one end of the serpentine conductor is connected to one plate 12, the other end is connected to plate 13, and the bight portions are also connected to the plates 12 and 13. In order to maintain the overall length of the thermocouple constant under varying temperature conditions, kinks 22 may be provided to take up any contraction or expansion of the serpentine conductor 21 upon either cooling or heating.

Referring now to FIG. 3 of the drawings, an air conditioner, embodying a plurality of the novel thermocouples of this invention, is set forth. The numeral 23 denotes an electrical conductor which abuts the outer surface of plate 11 of the couple. The numeral 24 denotes another electrical conductor which abuts the outer face of plate 14. The lower end of conductor 24 abuts the outer surface of plate 11 of another couple. The numeral 25 denotes another electrical conductor whose top or upper portion abuts the outer surface of plate 14 of the last mentioned couple and whose lower end abuts the outer surface of plate 11 of yet another couple. The numeral 26 denotes still another electrical conductor whose upper portion abuts the outer surface of plate 14 of the last mentioned couple. As many other conductors, such as 27 and 28, are supplied as are required to complete the circuit through all the thermocouple modules. It will be appreciated that alternate modules are reversed with respect to each other.

The numeral 29 denotes a duct, one end of which communicates with a fan 30 for flowing in a fluid 31 which is to be conditioned by the air conditioning device. The upper end of duct 29 communicates with the lower end of the air conditioning device and supplies the fluid, here air, to the aligned spaces 19 (see FIG. 1) of the plurality of thermocouples. Should the plurality of couples embody the serpentine conductor 21 of FIG. 2, the upper end of duct 29 would communicate with the aligned passages 190 of such a construction.

OPERATION

In operation, unidirectional current is passed from a positive lead to conductor 23 through the top couple and thence to the upper portion of conductor 24. From there, it flows through the lower portion of conductor 24 to the couple immediately below and thence to the upper portion of conductor 25. From there, it flows from the lower portion of conductor 25 to the next below couple and thence to the upper portion of conductor 26. It will be seen that the path of the current is always downwardly and alternately from left to right and right to left in succeeding couples.

If desired, the left conductors 23, 25 et al. may be replaced by a single conductor which connects all billets of the same type and similarly for the right conductors 24, 26 et al. In such a construction, the current flow will be in the same direction in all couples. The number of couples employed may be varied at will and, for the purposes of illustration, it is assumed that the last couple is connected between conductors 27 and 28, the assumed direction of current being from conductor 27 to conductor 28 to the negative power lead.

Upon such an assumed current polarity through each of the couples, and assuming the illustrated orientations of the n- and p-types with respect to the assumed polarity of current flow, the junction connectors 17 and 18 (or 21) will abstract heat from the air passing upwardly through duct 29. The air emanating from the upper portion of the air conditioning device is now at a lower temperature than the fluid 31 coming into fan 30. To remove heat, casing sections 32 and 33 are provided and are internally threaded by fluid passageways 34 and 35 through which a cooling fluid is pumped. The sections are in thermal contact with conductors 23 through 28 but are electrically insulated therefrom (by means not shown). The purpose of the cooling fluid is to remove heat from the conductors 23 to 28 inclusive, since they will become heated due to their contact with external plates 11 and 14.

A modification of the FIG. 3 device is illustrated in FIGS. 4 and 5 of the drawings. Here the heat liberating portions of the junction (blocks 15 and 16) are joined by sinuous conductors 36 and 37, and the conductors both carry current and dissipate heat. Due to its relatively large surface area, use of such a conductor generally obviates the need for forced liquid circulation to carry away heat; dissipation by radiation and natural convection alone being sufficient. The conductor elements 36 and 37 may be regarded as the severed upper and lower portions respectively of conductor 24 (of FIG. 3) if it were cut horizontally in half. Assuming a positive polarity at the left of the uppermost couple in FIG. 4, the current will enter plate 14 of the top couple, pass downwardly through conductor 36, thence to plate 11 and from right to left in the next couple. As best seen in FIG. 5, top ribbon conductor 36 electrically contacts plates 14 and 11 along the edges of the bight portions to provide, as in FIGS. 1 and 2, a plurality of current paths between opposite thermoelectric types. The same polarity sequence is assumed for the below pair of couples and their associated plates 14 and 11, sinuous conductor 37 electrically connecting the latter.

The abstraction of heat by serpentine conductor 21 is is accompanied by a heating of conductors 36 and 37 (along with their counterparts on the left half of the device). The latters' large surface area will be sufficient for heat removal in many environments. It will be understood that conductors such as 18 and 17 of FIG. 1 may be employed in this embodiment of the invention in lieu of the serpentine conductor 21 or sinuous conductors 36 and 37. Further, the heat liberating conductors 36 and 37 may be placed in a fluid path for forced circulation should radiation and natural convection alone not dissipate the heat rapidly enough.

Figures 6, 7:
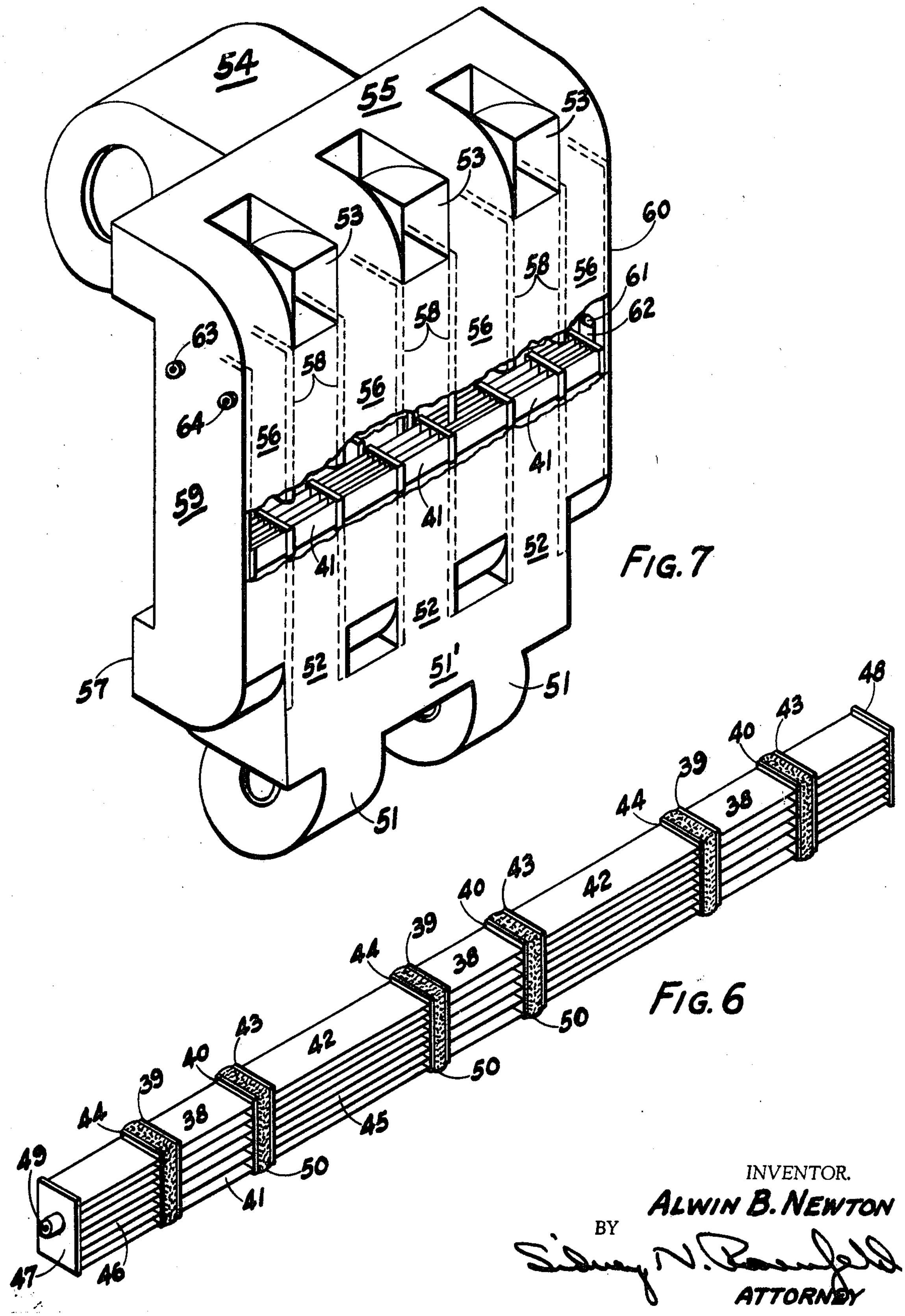
FIG. 6 is a perspective view of a second embodiment of the novel thermoelectric module according to the invention.
FIG. 7 is a partly schematic perspective view of a device embodying a plurality of the FIG. 6 thermoelectric modules according to this invention for conditioning a fluid.

A further embodiment of the invention is illustrated in FIG. 6 of the drawings. Here an assembly of thermocouple modules, similar to module 10, is arranged for most efficient adaptation to transferring heat between different streams of gaseous fluids. A first set of thermocouple modules 38, having opposing end plates 39 and 40 and a plurality of electrically conducting heat transfer fins 41, are arranged in staggered linear relationship with a second set of thermocouple modules 42, having opposing end plates 43 and 44 and a plurality of electrically conducting heat transfer fins 45. The fins 41 and 45 are preferably soldered to the adjacent plates 39–40 or 43–44 of the modules 38 and 42 to form a continuous electrical circuit through and between the couples. At the terminal end plates of this series of couples 38 and 42 are attached two additional sets of heat tarnsfer fins 46. While in FIG. 6, al sets of heat transfer fins are shown in the same plane, it is obvious that each individual set of fins may occupy any plane required for proper air flow through an assembly. The terminal ends of conducting fins 46 are joined by conducting plates 47 and 48. Each plate 47 and 48 incorporates an electrical contact 49. The spaces between plates 40–43 and plates 44–39 of the series are filled with an electrical and thermal insulation 50. The outer edges of insulation 50 describe a smooth geometrical shape for use in assembly within a device as will be later described. A plurality of n- and p-type elements (not shown), such as 15 and 16 in FIG. 1, are interposed alternately between plates 44–39 and 40–43.

In operation a unidirectional current is passed in one polarity through a circuit including contact 49 on conductor plate 47, fins 46, the first thermocouple module 38, including plates 41, the next thermocouple module 42, including the fins 45, etc. and the second set of fins 46 to the conducting plate 48 and its associated contact 49. At each thermocouple plate, 39 and 40, heat will be received thus cooling fins 41 and thereby cooling any gas which flows through them. The heat received at plates 39 and 40 will be delivered together with additional heat produced by the electrical flow to plates 44 and 43 of the next adjacent thermocouple module, thus heating fins 45 and also terminal fins 46. This heat is discharged to any gas which flows through the fins. Any contact heat at contacts 49 will be removed by fins 46 without influencing the cooling effect of adjacent fins 41. Fins 45 and 46 will normally embody more area for heat transfer than fins 41, since more heat is rejected by them than is received by fins 41.

If the polarity of the unidirectional current through the assembly is reversed with respect to the contacts 49, heat will be absorbed by plates 43 and 44 of each thermocouple module 42, thus cooling fins 45 and also fins 46 including any gas stream flowing therethrough. The heat so absorbed will be transferred to plates 39 and 40 of each thermoplastic module 38 and thence to fins 41, which will be heated thereby and are then capable of heating any gas stream flowing therethrough. In a practical application it is usual that the amounts of heat transferred by fins 41 is no greater on a heating cycle than the amount of heat transferred to them during a cooling cycle. However, should greater amounts of heat need to be transferred for heating, the relative size of fins 41 can be increased with respect to the size of fins 45 and 46.

Referring now to FIG. 7 of the drawings, an air conditioning device employing a plurality of the novel thermocouple assemblies of FIG. 6 of this invention is set forth.

The numeral 51 illustrates blowers for receiving a gas normally to be cooled, and delivering this gas to plenum chamber 51', and thence to ducts 52 in which are deposited the fins 41 of a plurality of the assemblies shown in FIG. 6. The gas after passing through fins 41 exits from the device through openings 53. Numeral 54 illustrates a blower for circulating a sink gas normally for the receipt of the rejected heat. Blower 54 delivers the sink gas to plenum 55 and thence to ducts 56, in which are located the fins 45 and 46 of a plurality of thermoelectric assemblies of the type shown in FIG. 6. The sink gas exits from the device through openings 57. Ducts 52 and 56 are separated by baffles 58 preferably of a thermally insulating type, in which suitable openings are made for receiving the geometric exteriors of the insulation 50 between each set of thermal plates 40–43 and 39–40 of the thermocouple modules 38 and 42. Thus insulation 50 forms a gas tight seal within the baffles 58 to separate the flow of gas in the adjacent ducts 52 and 56.

The end panels 59 and 60 of the air conditioning device shown in FIG. 7 incorporate suitable electrical contacts 61, and connecting strips 62 to establish the desired pattern of electrical current flow through the thermoelectric assemblies. Alternate thermoelectric assemblies are inserted in a reversed position, so that current flows back and forth always in a direction to produce the same effect of either cooling or heating on fins 41 throughout the unit. The connecting strips 62 are also connected to external electrical terminals 63 and 64 for application of the unidirectional current to energize the device.

If desired, the thermoelectric assemblies of FIG. 6 may be arranged in a plurality of electrical circuits in the device of FIG. 7, in which case additional terminals similar to 63 and 64 will be provided. For example, if it is known that a given device should dehumidify without producing its normal full sensible cooling effect, a selected number of thermoelectric assemblies can be inserted in the device near the conditioned gas outlet 53 in a position of reversed polarity, so that their fins 41 will provide heat at the same time the fins 41 in the remainder of the assembly will be cooling and dehumidifying the same stream. if this dehumidifying and reheating action is desired only a portion of the time, these fins may be arranged in a separate electrical circuit with separate terminals, the power to which may be separately controlled both as to application and polarity.

I wish it to be understood that my invention is not to be limited to the specific constructions and arrangements shown and described, except only insofar as the claims may be so limited, as it will be apparent to those skilled in the art that changes may be made without departing from the principles of the invention.

I claim:

1. A linear thermoelectric assembly for use in selectively heating and cooling adjacent fluid streams comprising a plurality of n- and p-type thermoelectric elements; a first plurality of electrically conducting heat transfer fins for disposal in a first fluid stream, said fans being in thermal and electrical communication with one of said thermoelectric elements; a second plurality of electrically conducting heat transfer fins for disposal in a second fluid stream, said fins being in thermal and electrical communication at one edge with the said one thermoelectric element, and in thermal and electrical communication at an opposite edge with the opposite type thermoelectric element; and a third plurality of electrically conducting heat transfer fins for disposal in the first fluid stream and in thermal and electrical contact with the said opposite thermoelectric element.

2. The thermoelectric assembly of claim 1, in which the n and p elements are are surrounded by insulation having a smooth external surface of a predetermined shape.

3. A thermoelectric conditioning device including a plurality of linear thermoelectric assembiles as set out in claim 2 for use in selectively heating and cooling adjacent fluid streams, a plurality of baffles for receiving the thermoelectric assemblies, each baffle being perforated by suitably shaped holes to sealingly engage the said insulation surrounding the n and p elements thus to establish separate ducts for the flow of conditioned fluid streams and for the flow of sink fluid streams.

4. The thermoelectric conditioning device of claim 3, including end enclosures containing electrical contacts for contacting the thermoelectric assemblies at their terminal points, electrical connections between said contacts for determining the sequence of electrical flow through the thermoelectric assemblies and electrical terminals for attachment to a power source.

5. The thermoelectric conditioning device of claim 3, including a pair of blowers for supplying the fluid to be conditioned and the sink fluid to the respective passages established by the baffles within the device.

6. The thermoelectric conditioning device of claim 3, including a pair of blowers for circulating the fluid to be conditioned and the sink fluid through alternate interposed ducts established by the baffles of the conditioning unit.

7. In a thermoelectric device, an electrically and thermally conductive heat exchanger, said heat exchanger comprising a pair of spaced base members having a plurality of spaced fins extending laterally between and joined to said base members, a layer of thermoelectric material mounted on each of said base members, one of said layers being formed from thermoelectrically positive material and the other of said layers being formed from thermoelectrically negative material, a plurality of heat exchange fins secured to each of said thermoelectric layers, terminal means connected to said last mentioned fins to form a current path serially through said fins, said thermoelectric layers and through said heat exchanger.

8. In a thermoelectric device, an electrically and thermally conductive heat exchanger, said heat exchanger comprising a pair of spaced base members having a plurality of spaced generally planar fins extending laterally between and joined to said base members, a layer of thermoelectric material mounted on each of said base members, one of said layers being formed from thermoelectrically positive material and the other of said layers being formed from thermoelectrically negative material, a plurality of heat exchange fins secured to each of said thermoelectric layers, said last mentioned fins extending in a plane positioned laterally with respect to the plane of said heat exchanger fins, terminal means connected to said heat exchange fins for passing current serially through said fins, said thermoelectric layers and through said heat exchanger.

9. In a thermoelectric device, a pair of spaced heat exchangers formed from electrically and thermally conductive material, each of said heat exchangers including a base member and a plurality of spaced heat exchange fins extending laterally from said base member, a layer of thermoelectric material secured to a surface on each of said base members, a heat exchange means including a plurality of electrically conducting fins thereon mounted in bridging relationship between said layers of thermoelectric material, whereby a series current flow path is formed through said heat exchangers, said thermoelectric layers and said heat exchange means.

10. In a thermoelectric device, a first and a second heat exchanger, each of said heat exchangers comprising a pair of spaced base members and a plurality of heat exchange fins extending laterally between and secured to each of said base members, a pair of layers of thermoelectric material secured to said heat exchangers and mounted on said base members thereof respectively, a first heat transfer means comprising a base member and a plurality of laterally extending fins secured to one of said thermoelectric layers of said first heat exchanger, a second heat transfer means comprising a base member and a plurality of laterally extending heat transfer fins secured to one of said thermoelectric layers of said second heat exchanger, a third heat transfer means comprising a base member secured in bridging relationship to the others of said thermoelectric layers of said first and said second heat exchangers, said third heat transfer means having a plurality of spaced fins extending laterally from said base member, and terminal means connected to said first and said second heat transfer means.

11. In a thermoelectric heating and cooling device, a first and a second heat exchanger, each of said heat exchangers comprising a pair of spaced base members and a plurality of laterally extending heat exchange fins secured to each of said base members, a pair of layers of thermoelectric material secured to each of said heat exchangers and mounted on said base members, respectively, a first heat transfer means comprising a base member and a plurality of laterally extending fins secured to one of said thermoelectric layers of said first heat exchanger, a second heat transfer means comprising a base member and a plurality of laterally extending heat transfer fins secured to one of said thermoelectric layers of said second heat exchangers, a third heat transfer means comprising a base member secured in bridging relationship to the others of said thermoelectric layers of said first and said second heat exchangers, said third heat transfer means having a plurality of spaced fins extending laterally from said base member, and terminal means connected to said first and said second heat transfer means, said thermoelectric material being chosen of a polarity so as to provide one of the conditions of thermoelectric heating and thermoelectric cooling to both said first and said second exchangers and to induce the other of said conditions of thermoelectric heating and thermoelectric cooling to each of said first, second and third heat transfer means.

References Cited

UNITED STATES PATENTS

| | | | |
|---|---|---|---|
| 2,729,949 | 1/1956 | Lindenblad | 62—3 |
| 2,837,899 | 6/1958 | Lindenblad | 136—204 X |
| 2,949,014 | 8/1960 | Belton et al. | 136—204 X |
| 2,997,514 | 8/1961 | Roeder | 136—204 |
| 3,040,538 | 6/1962 | Alsing | 136—204 X |
| 3,050,948 | 8/1962 | Jones | 136—204 X |
| 3,077,080 | 2/1963 | Pietsch | 62—3 |
| 3,086,067 | 4/1963 | Buchanan | 136—204 |

WILLIAM J. MAY, Primary Examiner

U.S. Cl. X.R.

136—200, 203, 204